(12) United States Patent
Dhindsa

(10) Patent No.: US 10,032,604 B2
(45) Date of Patent: Jul. 24, 2018

(54) REMOTE PLASMA AND ELECTRON BEAM GENERATION SYSTEM FOR A PLASMA REACTOR

(71) Applicant: Applied Materials, Inc., Santa Clara, CA (US)

(72) Inventor: Rajinder Dhindsa, Pleasanton, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 14/968,121

(22) Filed: Dec. 14, 2015

(65) Prior Publication Data

US 2017/0092467 A1    Mar. 30, 2017

Related U.S. Application Data

(60) Provisional application No. 62/233,020, filed on Sep. 25, 2015.

(51) Int. Cl.
| | | |
|---|---|---|
| *H01L 21/00* | (2006.01) | |
| *H01J 37/32* | (2006.01) | |
| *C23C 14/22* | (2006.01) | |
| *C23C 16/505* | (2006.01) | |
| *H01L 21/67* | (2006.01) | |
| *H01L 21/3065* | (2006.01) | |

(52) U.S. Cl.
CPC ........ *H01J 37/32082* (2013.01); *C23C 14/22* (2013.01); *C23C 16/505* (2013.01); *H01J 37/32357* (2013.01); *H01J 37/32633* (2013.01); *H01J 37/32715* (2013.01); *H01L 21/67069* (2013.01); *H01J 2237/334* (2013.01); *H01J 2237/3321* (2013.01); *H01L 21/3065* (2013.01); *H01L 21/67207* (2013.01)

(58) Field of Classification Search
CPC ......... H01L 21/67069; H01L 21/67207; H01L 21/3065
See application file for complete search history.

(56) References Cited

U.S. PATENT DOCUMENTS

| 5,266,364 A | 11/1993 | Tamura et al. | |
|---|---|---|---|
| 6,635,578 B1 * | 10/2003 | Xu | .................... H01J 37/32009 438/706 |

(Continued)

FOREIGN PATENT DOCUMENTS

WO    2013019565 A2    2/2013

OTHER PUBLICATIONS

International Search Report and Written Opinion for PCT/US2016/045196 dated Nov. 7, 2016.

*Primary Examiner* — Jaehwan Oh
*Assistant Examiner* — John M Parker
(74) *Attorney, Agent, or Firm* — Patterson + Sheridan LLP

(57) ABSTRACT

Embodiments of an apparatus having an improved coil antenna assembly with a remote plasma source and an electron beam generation system that can provide enhanced plasma in a processing chamber. In one embodiment, a plasma processing chamber includes a chamber body, a lid enclosing an interior volume of the chamber body, a substrate support disposed in the interior volume, a dual inductively coupled source including a coil antenna assembly coupled to the chamber body through the lid, and a remote plasma source coupled to the chamber body through the lid.

18 Claims, 3 Drawing Sheets

(56) References Cited

U.S. PATENT DOCUMENTS

| | | |
|---|---|---|
| 6,983,892 B2 | 1/2006 | Noorbakhsh et al. |
| 7,426,900 B2 | 9/2008 | Brcka |
| 8,900,403 B2 | 12/2014 | Holland et al. |
| 9,039,911 B2 | 5/2015 | Hudson et al. |
| 9,147,581 B2 | 9/2015 | Guha |
| 2002/0041160 A1* | 4/2002 | Barnes ............... H01J 37/321 315/111.21 |
| 2004/0182834 A1 | 9/2004 | Kamarehi |
| 2004/0191545 A1 | 9/2004 | Han et al. |
| 2005/0020070 A1 | 1/2005 | Ichiki et al. |
| 2005/0239291 A1 | 10/2005 | Alba et al. |
| 2006/0162863 A1 | 7/2006 | Kim et al. |
| 2007/0068624 A1 | 3/2007 | Jeon et al. |
| 2009/0008577 A1 | 1/2009 | Walther |
| 2009/0236315 A1 | 9/2009 | Willwerth et al. |
| 2011/0048644 A1 | 3/2011 | Collins et al. |
| 2011/0097901 A1 | 4/2011 | Banna et al. |
| 2011/0174441 A1 | 7/2011 | Yamashita et al. |
| 2012/0043023 A1 | 2/2012 | Ramaswamy et al. |
| 2012/0097870 A1 | 4/2012 | Leray et al. |
| 2012/0103524 A1 | 5/2012 | Chebi et al. |
| 2012/0104950 A1 | 5/2012 | Banna et al. |
| 2012/0211358 A1 | 8/2012 | Miller et al. |
| 2012/0258606 A1 | 10/2012 | Holland et al. |
| 2014/0356768 A1* | 12/2014 | Wu ..................... G03F 1/80 430/5 |
| 2015/0083582 A1 | 3/2015 | Dhindsa et al. |
| 2015/0206775 A1 | 7/2015 | Hudson et al. |
| 2015/0279634 A1 | 10/2015 | Pal et al. |
| 2015/0364339 A1 | 12/2015 | Guha |
| 2015/0364349 A1 | 12/2015 | Guha |

\* cited by examiner

REMOTE PLASMA AND ELECTRON BEAM GENERATION SYSTEM FOR A PLASMA REACTOR

CROSS-REFERENCE TO RELATED APPLICATIONS

This application claims benefit of U.S. Provisional Application Ser. No. 62/233,020 filed Sep. 25, 2015, which is incorporated by reference in its entirety.

BACKGROUND

Field

Embodiments generally relate to an apparatus of semiconductor substrate processing systems. More specifically, embodiments relates to a remote plasma generation assembly and an electron beam generation system for a plasma processing system.

Background

In manufacture of integrated circuits, precise control of various process parameters is required for achieving consistent results within a substrate, as well as the results that are reproducible from substrate to substrate. As the geometry limits of the structures for forming semiconductor devices are pushed against technology limits, tighter tolerances and precise process control are critical to fabrication success. However, with shrinking geometries, precise critical dimension and etch process control has become increasingly difficult.

Many semiconductor devices are processed in the presence of a plasma. The plasma may be easily ignited in processing chambers that utilized inductively coupled power to energize the gases forming the plasma. However, plasma ignition in other types of processing chambers may not be as easily initiated, often requiring a spike of power to ignite the gases within the chamber. Unfortunately, such power spikes often results in overly high temperature generation to chamber components, which diminish the service life of the chamber components and undesirably generate particles within the processing chamber which undesirably contributes to defect rates.

Furthermore, unstable source of the plasma source or ignition also result in ions/radical distribution non-uniform, resulting in ion/radical ratio and concentration gradient formed in the processing environment. Ion/radical ratio and concentration gradient may undesirably create non-uniform distribution of the plasma across the substrate, thereby resulting in etching rate non-uniform, thereby resulting over-etching or under-etching of the resultant structure formed on the substrate. In a deposition process, non-uniform plasma distribution may also result in film profile distortion or incomplete structure formation.

Therefore, there is a need for an apparatus and methods for improving control of the radical/ion ratio and distribution profile during a plasma process within a processing chamber.

SUMMARY

Embodiments generally provide an improved coil antenna assembly with a remote plasma source that can provide enhanced plasma ignition in a processing chamber. Additionally, an electron beam generation system may also be implemented in the processing chamber to enhance plasma distribution and ion/radical ratio control that may be utilized in etch, deposition, implant, and thermal processing systems, among other applications.

In one embodiment, a plasma processing chamber includes a chamber body, a lid enclosing an interior volume of the chamber body, a substrate support disposed in the interior volume, a dual inductively coupled source including a coil antenna assembly coupled to the chamber body through the lid, and a remote plasma source coupled to the chamber body through the lid.

In another embodiment, a plasma processing chamber includes a chamber body, a lid enclosing an interior volume of the chamber body, a substrate support disposed in the interior volume, a dual inductively coupled source including a coil antenna assembly coupled to the chamber body through the lid and an electron beam generation system disposed in the interior volume of the chamber body adjacent to an inner wall in the chamber body.

In yet another embodiment, a method for operating a processing chamber includes generating a plasma from a dual inductively coupled plasma source formed from a coil assembly disposed in a processing chamber in an interior volume defined in the processing chamber, generating an electron beam in the interior volume of the processing chamber while generating the plasma; and directing a remote plasma source to the plasma distributed in the interior volume of the processing chamber while generating the electron beam therein.

BRIEF DESCRIPTION OF THE DRAWINGS

So that the manner in which the above recited features of the embodiments as provided can be understood in detail, a more particular description of the embodiments, briefly summarized above, may be had by reference to embodiments, some of which are illustrated in the appended drawings. It is to be noted, however, that the appended drawings illustrate only typical embodiments as described herein and are therefore not to be considered limiting of its scope, may admit to other equally effective embodiments.

Figure 1:
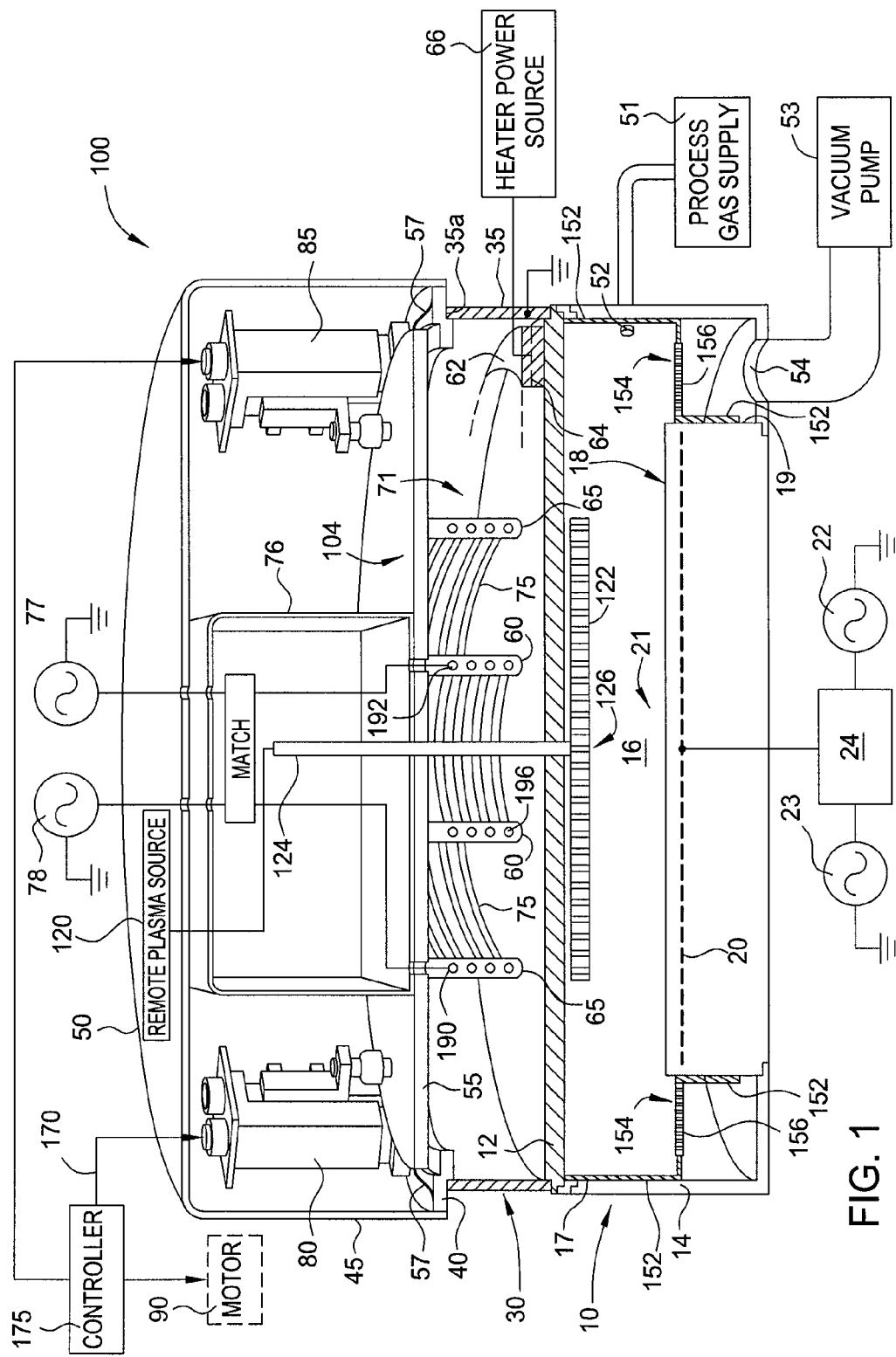
FIG. 1 is a schematic diagram of an exemplary semiconductor substrate processing apparatus comprising a remote plasma source in accordance with one embodiment.

To facilitate understanding, identical reference numerals have been used, where possible, to designate identical elements that are common to the figures. It is also contemplated that elements and features of one embodiment may be beneficially incorporated on other embodiments without further recitation.

DETAILED DESCRIPTION

Embodiments generally provide an improved processing chamber with a remote plasma source and/or an electron beam generation system that can provide enhanced plasma distribution in the processing chamber. The remote plasma source as well as the electron beam generation system enhances control of plasma location and distribution in a plasma processing chamber, and may be utilized in etch, deposition, implant, and thermal processing systems, among other applications where the control of plasma location is desirable.

FIG. 1 is a schematic diagram of an exemplary semiconductor substrate processing apparatus 100 comprising a remote plasma source 120 as well as a coil antenna assembly 104. In one embodiment, the semiconductor substrate processing apparatus 100 of FIG. 1 may be configured to perform a reactive ion etch process using an RF inductively coupled plasma generated by the coil antenna assembly 104 and the remote plasma source 120 disposed in the semiconductor substrate processing apparatus 100. It is also contemplated that the coil antenna assembly 104 as well as the remote plasma source 120 may beneficially be utilized in other types of plasma processing chambers, including chemical vapor deposition chambers, physical vapor deposition chambers, implantation chambers, nitriding chambers, plasma annealing chambers, plasma treatment chambers, and ashing chambers, among others. Thus, the embodiment of exemplary semiconductor substrate processing apparatus 100 of FIG. 1 is provided for illustrative purposes and should not be used to limit the scope of the embodiments.

The semiconductor substrate processing apparatus 100 includes a chamber body 10 including a lid 12 and a cylindrical side wall 14 defining a processing chamber 16 enclosing a processing region 21 therein. The lid 12 is transmissive to RF power and allows coupling of RF power provided by a dual inductively coupled plasma source power applicator 71 positioned above the lid 12 to process gases within the processing chamber 16. The lid 12 may be fabricated from any suitable material, and in the embodiment depicted in FIG. 1, the lid 12 is fabricated from a dielectric material, such as quartz.

A lid heater 62 is disposed on the lid 12 outside of the processing chamber 16. Although only a portion of the lid heater 62 is shown in FIG. 1, the lid heater 62 extends substantially across and covers substantially the entire lid 12. The lid heater 62 controls the temperature of the lid 12, so as to control the deposition and adhesion of by-products to the lid 12, which enhances particle control. The lid heater 62 may be a resistive or other type of heater, and in the embodiment depicted in FIG. 1, the lid heater 62 includes a resistive heating element 64 coupled to a heater power source 66.

Inside the processing chamber 16 is a substrate support pedestal 18 including a bias electrode 20. Dual plasma bias generators 22, 23, either inductively coupled plasma or capacitively coupled plasma, are coupled through an RF bias impedance match 24 to the bias electrode 20. Although the embodiment depicted here includes the dual plasma bias generators, it is noted that the number and the types of the plasma bias generators may be in any numbers or in any forms. A process gas supply 51 provides process gas into the processing chamber 16 through process gas distribution apparatus 52 which may be provided in the side wall 14 (as shown) or in the lid 12, for example. A vacuum pump 53 evacuates the processing chamber 16 through a pumping port 54.

It is noted that, alternatively, the dual plasma bias generators 22, 23 may be any suitable types of bias source, including inductively coupled bias source, capacitively coupled bias source or shape bias source as needed.

An coil antenna enclosure 30 formed of metal is provided above the lid 12 and includes a metallic grounded base cylindrical side wall 35 having a top edge 35a supporting a shoulder ring 40, and a conductive top cylindrical side wall 45 extending from the shoulder ring 40 and supporting an overlying conductive cover 50. The conductive cover 50 and the top cylindrical side wall 45 may be integrally formed together and may be coupled to ground. A floating support plate 55 is located on or slightly above the shoulder ring 40, and is supported in a manner to be described below.

The dual inductively coupled plasma source power applicator 71 is disposed in the semiconductor substrate processing apparatus 100 configured to generate inductively coupled plasma. The dual inductively coupled plasma source power applicator 71 includes the coil antenna assembly 104 and a remote plasma source 120 coupled thereto. The coil antenna assembly 104 is supported below the support plate 55 by two sets of brackets 60, 65 extending downwardly from the support plate 55. The coil antenna assembly 104 includes at least one coil antenna, and in the embodiment depicted in FIG. 1, the coil antenna assembly 104 includes one or more inner coil antennas 70 and one or more outer coil antennas 75. The outer coil antenna 75 may be concentric with the inner coil antenna 70. The brackets 60 support the inner coil antenna 70 while the brackets 65 support the outer coil antenna 75 above the chamber lid 12. The coil antennas 70, 75 may have a helical configuration. First ends 190, 192 of each coil antennas 75, 70 are coupled through a RF impedance match box 76 to dual or more RF power generators 77, 78 while second ends 194, 196 of each coil antennas 75, 70 are coupled to ground. This creates a voltage drop across the coil antennas 75, 70 such that the first ends 190, 192 have a greater voltage potential relative to the second ends 194, 196 of the coil antennas 75, 70.

The RF impedance match box 76 rests on the support plate 55. The first RF power generator 77 is coupled to the inner coil antenna 70 through impedance match elements (not shown) in the impedance match box 76. The second RF power generator 78 is coupled to the outer coil antenna 75 through other impedance match elements (not shown) in the impedance match box 76. The dual RF power generators 77, 78 may provide an enhanced plasma density to the processing chamber 16 during process.

During plasma processing, the coil antenna assembly 104 is energized with RF power provided by the power generators 77, 78 to maintain a plasma formed from the process gasses within in the internal volume of the chamber body 10.

A flexible RF gasket 57 provides an RF shield and electrical continuity between the shoulder ring 40 and the floating support plate 55. The RF gasket 57 may be an annular copper mesh, and may be interrupted to accommodate the support servos described below. The support plate 55 is supported by three support servos 80, 85, 90 placed at equal (120 degree) intervals on the shoulder ring 40. The support servos 80, 85, 90 are identical in one embodiment.

The remote plasma source 120 is coupled to the lid 12 through a RF feedthrough 124. The RF feedthrough 124 is further coupled to a baffle plate 126 having a plurality of apertures 126 formed therein that allows the ions/radicals from the remote plasma source 120 to pass through the baffle plate 126 to the processing chamber 16. A plasma may be generated remotely from the remote plasma source 120 and then later supplied through the baffle plate 126 into the processing chamber 16 for processing. The baffle plate 126 is in parallel and facing an upper surface of the substrate support pedestal 18.

In one example, the baffle plate 126 may be rotatable so as to assist distributing the gases or remote plasma passing therethrough with a better uniformity. The baffle plate 126 may be rotated clockwise or counterclockwise at any speed as needed.

The remote plasma source 120 along with the dual ICP source 77, 78 may efficiently control the ions and radicals formed in the plasma distributed in the processing chamber 16 for processing.

A liner 152 is formed on an inner wall 17 of the chamber body 10 extending to side surfaces 19 of the substrate support pedestal 18 bridging by a confinement ring 154 disposed therebetween. The liner 152 may help maintain the chamber body 10 and the processing chamber 16 at a desired temperature range. Additionally, the liner 152 may also provide a protection to the inner wall 17 of the chamber body 10 to prevent the chamber component from plasma attack during processing. In one embodiment, the liner 152 may be formed by any insulating material that is inert to the plasma generated in the processing chamber 16. Suitable materials for the liner 152 includes aluminum nitride, aluminum oxide, anodized aluminum, yttrium coating material, or any suitable materials.

Additionally, the confinement ring 154 may also be disposed in the processing chamber 16 circumscribing a periphery region of the substrate support pedestal 18. The confinement ring 154 bridges between the liner 154 formed on the inner wall 17 of the chamber body 10 and the side surface 19 of the substrate support pedestal 18. The confinement ring 154 comprises a plurality of slots 156 that allows the plasma or gases to pass therethrough. The slots 156 in the confinement ring 154 allow the process gas mixture to pass through and reduce the flow resistance across the processing chamber 16. Neutrals in the plasma are configured to pass through the slots 156 to be pumped out of the processing chamber 16 through the vacuum pump 53.

The confinement ring 154 provides good plasma confinement and reduces flow resistance across the processing chamber 16. The confinement ring 154 may be made of conductive materials, such as silicon carbide (SiC) or aluminum (Al). Structures other than the slots 156 in the confinement ring 154 and materials with different mechanical strength that may also be utilized for the confinement ring 154 to provide good flow conductance as well as provide good mechanical strength for the confinement ring 154 holding against the inner wall 17 of the chamber body 10 and the side surface 19 of the substrate support pedestal 18.

A control signal cable 170 furnishes electrical control signals and power from a central controller 175 of the semiconductor substrate processing apparatus 100 of FIG. 1. The central controller 175 controls each of the three support servos 80, 85, 90. Placement of the three support servos 80, 85, 90 at equal intervals around the shoulder ring 40 enables the controller 175 to rotate the floating support plate 55 about any tilt axis oriented along any azimuthal angle 0 relative to an axis of symmetry of the processing chamber 16.

Figure 2:
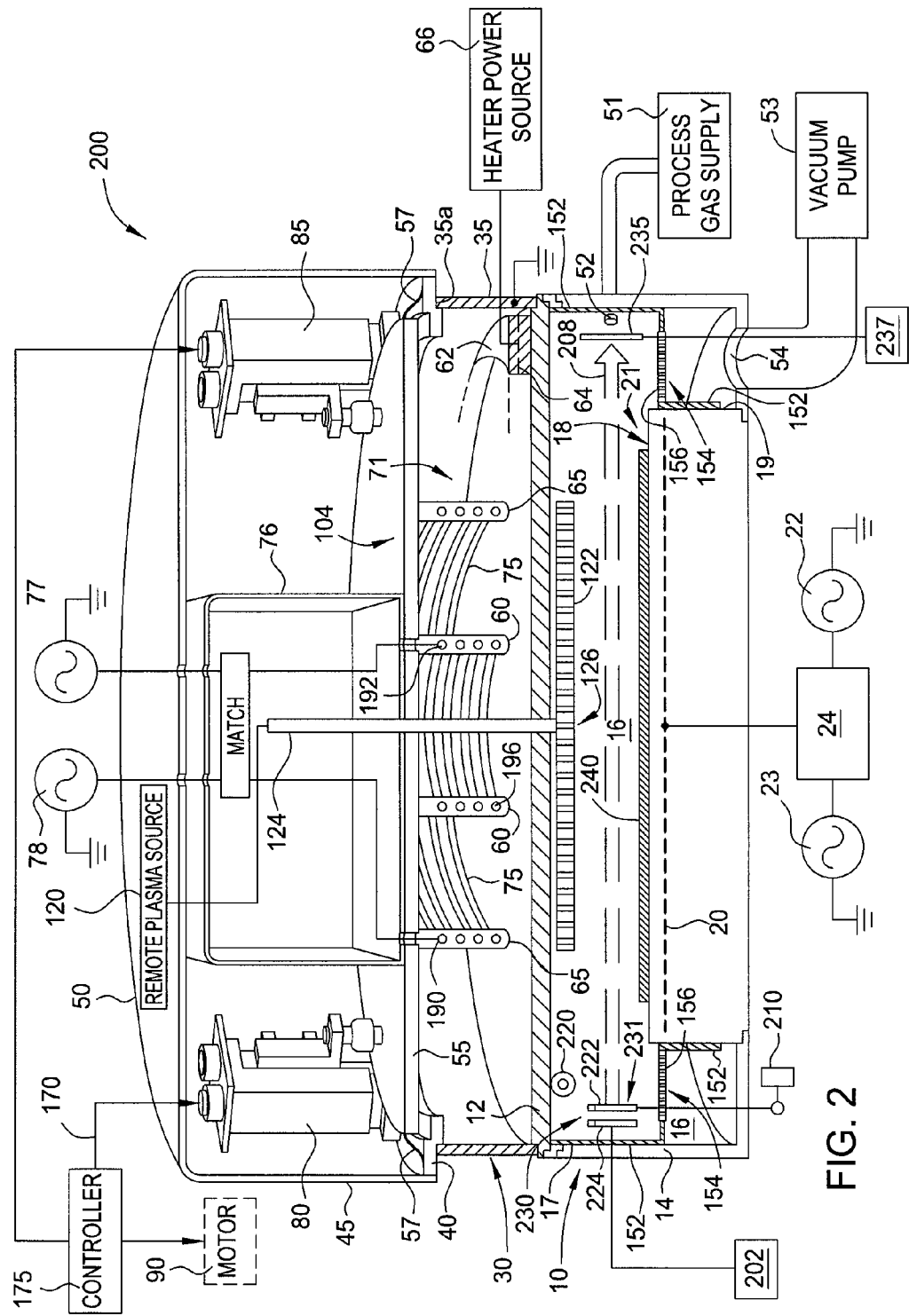
FIG. 2 is a schematic diagram of an exemplary semiconductor substrate processing apparatus comprising an electron beam generation system in accordance with one embodiment.

FIG. 2 is a schematic view of another embodiment of a semiconductor substrate processing apparatus 200 with an electron beam generation system 230 disposed in the processing chamber 16. An electron beam generation system 230 is disposed around the interior wall 17 of the chamber body 10. The electron beam generation system 230 includes an electron beam generation source 231 disposed adjacent to interior wall 17 of the chamber body 10. An electron beam source gas supply 202 is connected to the electron beam generation source 231 configured to supply gases to the electron beam generation source 231 to generate an electron beam plasma in the processing region 21 during processing.

The electron beam generation source 231 includes a profiled extraction grid 222 and an acceleration grid 224 disposed in the processing region 21 between the extraction grid 222 and the interior wall 17 of the chamber body 10. The profiled extraction grid 222 and the acceleration grid 224 may be formed as separate conductive sheets having apertures or holes formed therethrough, or as meshes, for example. In one example, the electron beam generation source 231 defines a thin wide electron beam flow path 208 (i.e., thin in the y direction while wide in the z direction) for an electron beam to laterally flow into the processing region 21.

The electron beam generation system 230 further includes a pair of electromagnets (not shown) aligned with the electron beam generation source 231 for producing a magnetic field parallel to the direction of the electron beam as generated (for example, in the x direction). It is noted that the electron beam generation source 231 may generate electron beam by any suitable manner, including other types of power sources. The electron beam as generated may enhance the plasma electron density generated in the processing region 21. The electron beam flows laterally in the x direction across the processing region 21, as indicted by the flow path 208, space above a substrate 240 disposed on the substrate support pedestal 18.

The electron beam passing above the substrate 240 is then absorbed and collected on the opposite side of the processing region 21 relative to the electron beam generation source 231 by an electron beam collector 235. The electron beam collector 235 is a conductive body having a shape and size adapted to capture the wide thin path of the electron beam along the path 208. The electron beam collector 235 may be held at a selected electrical potential, such as ground. An electron collector voltage source 237 is coupled to the electron beam collector 235 configured to supply a voltage to the electron beam collector 235 when drawing electrons from the electron beam generation source 231.

Referring back to the electron beam generation source side of the processing chamber 16, a beam voltage supply 210 is connected to the electron beam generation source 231 to supply voltage when opening the electron beam generation system 230. Electrons are extracted from the electron beam generation source 230 through the extraction grid 222 and the acceleration grid 224 to produce an electron beam that flows into the processing region 21. Electrons are accelerated to energies equal to the voltage provided by the beam voltage supply 210.

The electron beam generated from the electron beam generation source 23 ionizes the processing gases supplied from the process gas supply 202 as well as the plasma from the remote plasma source 120 and tee gas process supply source 51 into the processing region 21, forming electron beam plasma in the processing region 21. The electron beam plasma includes ions with different charges. The charged ions may be accelerated toward the substrate 240 as a result from a bias power from the RF bias power source 22, 23. The charged ions may then react with the material layers disposed on the substrate 240, thus etching and removing the material layer exposed by a patterned photoresist layer on the substrate 240.

Figure 3:
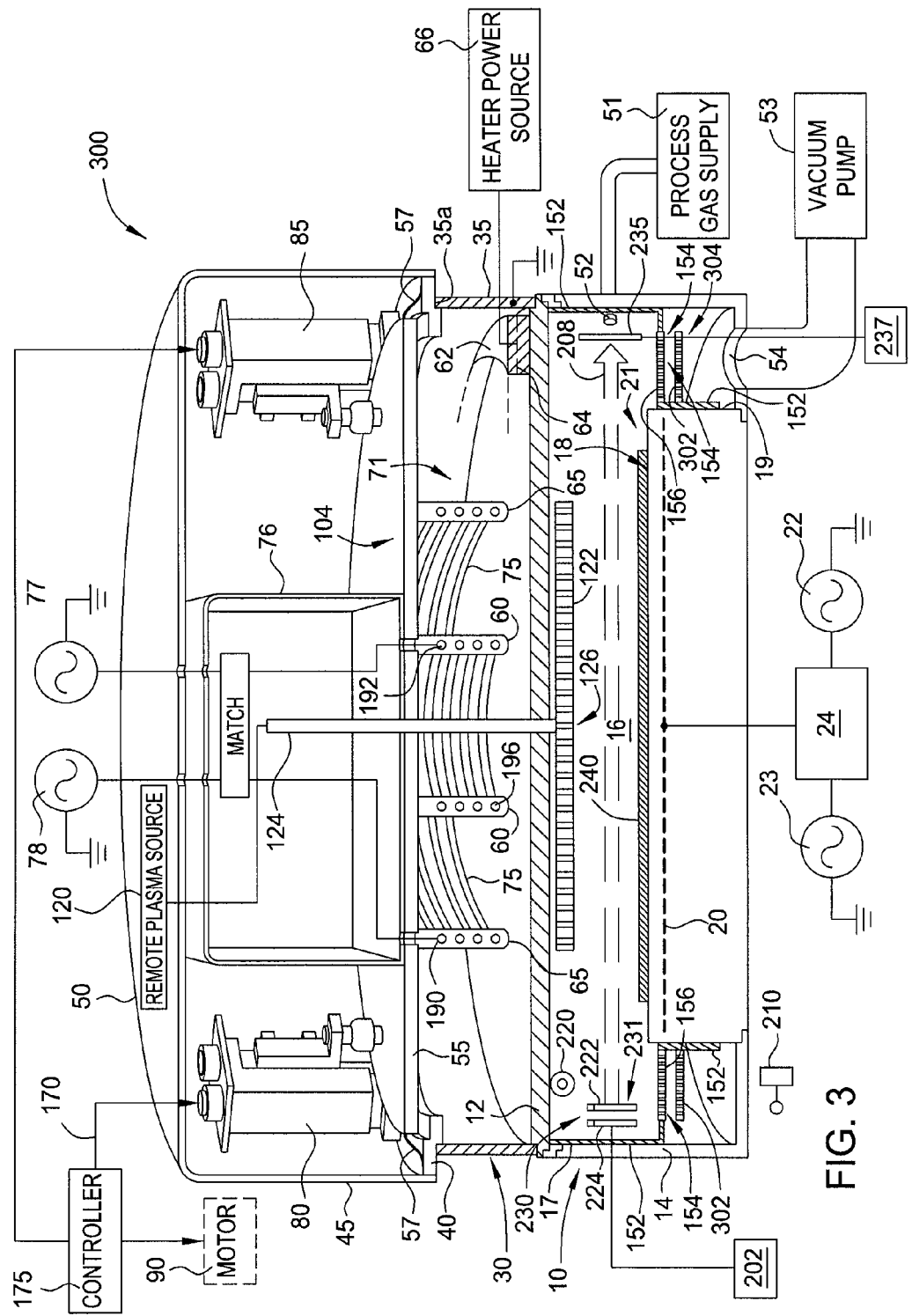
FIG. 3 is a schematic diagram of an exemplary semiconductor substrate processing apparatus comprising an electron beam generation system and a plasma confinement plate in accordance with one embodiment.

FIG. 3 depicts yet another embodiment of a semiconductor substrate processing apparatus 300 with an additional filter plate 320 disposed under the confinement ring 154. The filter plate 302 disposed under the confinement ring 154 may help compensate the unbalanced flow passing through the confinement ring 154 to the pumping port 54. The filter plate 302 may be positioned in a spaced-apart relationship to the confinement ring 154 circumscribing the periphery region of the substrate support pedestal 18. The filter plate 302 may also include a plurality of slots 304 aligned with the slots 156 formed in the confinement ring 154 that allow the gases from the processing region 21 to pass therethrough to the pumping port 54.

In one example, the filter plate 302 may have different distribution of slots 304 formed at different locations/regions of the filter plate 302. As the pumping port 54 may be formed on a certain side of the processing chamber 10, thus resulting in an enhanced flow passing through the certain side of the processing chamber 10 wherein the pumping port 54 is located. As a result, unbalanced gas flow often leads to non-uniform etching rate in the processing region 21 during an etching process. Thus, by forming different sizes, diameters of geometries of the slots 304 in the filter plate 302, non-uniform gas flow passing therethough may be balanced out so as to improve and gas flow distribution and/or plasma distribution across the substrate surface during the etching process.

In one embodiment, the filter plate 302 may be fabricated by quartz material or any suitable plasma resistant material. The density of the slots 304 of a first region of the filter plate 302 close to the pumping port 54 may be less than the density of the slots 304 in the second region of the filter plate 302 away from the pumping port 54 so as to efficiently reducing the pumping rate of the gas flow/plasma flow directly arrived from the first region of the filter plate 302 from the processing region 21. It is noted that the slots 304 formed in the filter plate 302 may be in any form, such as holes, apertures, square openings, or any suitable openings with different geometries.

Therefore, by utilizing a remote plasma source, an electron beam generation system and/or optionally an additional filter plate 302 in a processing chamber, ion density, ion distribution, ion/neutrals/radical ratios in the plasma may be efficiently controlled, so as to improve etching efficiency and performance. As the plasma and the ion/neutrals/radical ratios generated in the plasma can be positioned in a more desirable location and with better management with sufficient power density, more uniform and predictable processing requests may be realized.

While the foregoing is directed to embodiments as described herein, other and further embodiments may be devised without departing from the basic scope thereof, and the scope thereof is determined by the claims that follow.

What is claimed is:

1. A plasma processing chamber comprising:
a chamber body;
a lid enclosing an interior volume of the chamber body;
a substrate support disposed in the interior volume;
a dual inductively coupled source including a coil antenna assembly coupled to the chamber body through the lid, wherein the coil antenna assembly includes an outer coil concentric with an inner coil;
a remote plasma source coupled to the chamber body through the lid;
a confinement ring circumscribing a periphery region of the substrate support; and
a filter plate disposed below the confinement ring having a spaced apart relationship to the confinement ring and circumscribing the periphery region of the substrate support.

2. The chamber of claim 1, further comprising:
a dual bias power source coupled to the substrate support.

3. The chamber of claim 2, wherein the dual bias power source comprises capacitively coupled plasma source.

4. The chamber of claim 1, further comprising:
a shape bias source coupled to the substrate support.

5. The chamber of claim 1, further comprising:
an electron beam generation system disposed in the interior volume of the chamber body.

6. The chamber of claim 5, wherein the electron beam further comprises:
an electron beam generation source; and
an electron beam collector positioned opposite to and facing the electron beam generation source in the interior volume.

7. The chamber of claim 6, further comprising:
an electron collector voltage source coupled to the electron beam collector.

8. The chamber of claim 6, further comprising:
a beam voltage supply coupled to the electron beam generation source.

9. The chamber of claim 1, wherein the filter plate is fabricated by quartz.

10. The chamber of claim 1, further comprising:
a liner formed on an interior wall of the chamber body.

11. The chamber of claim 1, further comprising:
a baffle plate disposed under the lid coupled to the remote plasma source through a RF feedthrough.

12. The chamber of claim 11, wherein the baffle plate has a surface in parallel to an upper surface of the substrate support.

13. A plasma processing chamber comprising:
a chamber body;
a lid enclosing an interior volume of the chamber body;
a substrate support disposed in the interior volume;
a dual inductively coupled source including a coil antenna assembly coupled to the chamber body through the lid; and
an electron beam generation system disposed in the interior volume of the chamber body adjacent to an inner wall in the chamber body, wherein the electron beam generation system further comprises:
an electron beam generation source;
an electron beam collector positioned opposite to and facing the electron beam generation source in the interior volume;
a confinement ring circumscribing a periphery region of the substrate support; and
a filter plate disposed below the confinement ring having a spaced apart relationship to the confinement ring and circumscribing the periphery region of the substrate support.

14. The chamber of claim 13 further comprising:
a remote plasma source coupled to the chamber body through the lid.

15. The chamber of claim 13 further comprising:
a dual bias power source coupled to the substrate support.

16. The chamber of claim 13 further comprising:
a liner lining on the inner wall of the chamber body; and
a confinement ring circumscribing a periphery region of the substrate support.

17. The chamber of claim 14 further comprising:
a baffle plate disposed under the lid coupled to the remote plasma source through a RF feedthrough.

18. A plasma processing chamber comprising:
a chamber body;
a lid enclosing an interior volume of the chamber body;
a substrate support disposed in the interior volume;
a dual inductively coupled source including a coil antenna assembly coupled to the chamber body through the lid;
a remote plasma source coupled to the chamber body through the lid;

a confinement ring circumscribing a periphery region of the substrate support; and a filter plate disposed below the confinement ring having a spaced apart relationship to the confinement ring and circumscribing the periphery region of the substrate support.

* * * * *